United States Patent
Hong

[19]

[11] Patent Number: 5,960,285
[45] Date of Patent: Sep. 28, 1999

[54] FLASH EEPROM DEVICE

[75] Inventor: Gary Hong, Hsin-Chu, Taiwan

[73] Assignee: United Semiconductor Corp., Hsin-Chu, Taiwan

[21] Appl. No.: 08/975,490

[22] Filed: Nov. 21, 1997

Related U.S. Application Data

[60] Provisional application No. 60/050,607, Jun. 24, 1997.

[51] Int. Cl.[6] ................................................. H01L 21/336
[52] U.S. Cl. ........................... 438/264; 438/265; 257/321
[58] Field of Search .................................... 438/264, 265; 257/321

[56] References Cited

U.S. PATENT DOCUMENTS

| | | | |
|---|---|---|---|
| 5,273,923 | 12/1993 | Chang et al. | 437/43 |
| 5,516,713 | 5/1996 | Hsue et al. | 437/43 |
| 5,686,332 | 11/1997 | Hong | 437/43 |
| 5,756,385 | 5/1998 | Yuan et al. | 438/258 |

OTHER PUBLICATIONS

Wolf, S.; Silicon Processing for the VLSI Era, vol. 2; Lattice Press, Sunset Beach, Ca.; pp. 153–160, 332–334, 1990.

*Primary Examiner*—John F. Niebling
*Assistant Examiner*—Neal Berezny
*Attorney, Agent, or Firm*—Rabin & Champagne, P.C.

[57] ABSTRACT

A floating gate transistor is formed on an active device region defined between field isolation structures. A first polysilicon layer, or a layer of another conductor which can be used in diffusing impurities into the underlying silicon substrate, is provided on the active device region of the substrate and is covered by a layer of insulating material such as silicon oxide. The first polysilicon layer is doped by implantation of impurities, but no annealing step is performed at this time. An opening is formed through the polysilicon layer to expose the surface of the active device region. Oxide spacers and then nitride spacers are formed on the sidewalls of the opening in the first polysilicon layer to define a narrower opening. A gate oxide layer is grown on the active device region between the nitride spacers in a thermal oxidation process which preferably causes impurities to diffuse from the first polysilicon layer into the active device region on either side of the gate electrode, forming source/drain regions for the floating gate transistor. The nitride spacers are then removed in a wet etching process and then tunnel oxide layers are grown on the portions of the active device region exposed when the nitride spacers are removed. A second layer of polysilicon is deposited, followed by an interlayer dielectric and then a third layer of polysilicon. Patterning defines a control gate and a floating gate from the third and second layers of polysilicon, respectively, for the floating gate transistor.

26 Claims, 2 Drawing Sheets

FLASH EEPROM DEVICE

This application claims priority from provisional application Ser. No. 60/050,607, filed Jun. 24, 1997.

BACKGROUND OF THE INVENTION

1. Field of the Invention

This invention relates to the formation of floating gate field effect transistors and to the formation of nonvolatile memories using floating gate transistors.

2. Description of the Related Art

Nonvolatile memories are used in a variety of electronic devices for storing configuration data, program data and other data to be accessed on a repeated basis in the electronic devices. Recent applications have placed particular emphasis on programmable nonvolatile memories such as EEPROMs and especially on the flash memory configuration of EEPROMs. Flash memories have the comparative advantage of greater flexibility for changing the data in the EEPROMs either during the manufacturing process or after the electronic devices have been placed in the field. One typical implementation of a flash memory is illustrated in U.S. Pat. No. 5,416,349 to Bergemont, which describes a flash memory having a common source, buried bit line architecture as well as a configuration of a floating gate field effect transistor. The common source, buried bit line architecture of the Bergemont patent has the advantage of relatively high density, which is an important consideration for achieving low cost. Cost is a very important consideration for flash memories because the number of applications for which flash memories are suitable is highly cost sensitive. The Bergemont patent's architecture provides a high density of memory cells, which can provide a low cost flash memory. On the other hand, high density itself is insufficient to ensure that a flash memory is suitable for many applications. Low voltage operation, the ability to undergo repeated programming, and predictable operation are also important to determining how suitable a particular flash memory is for different applications.

Memory storage in flash EEPROMs is accomplished by selectively storing charge on the floating gate of a floating gate transistor. A generalized representation of a floating gate transistor similar to that used in the Bergemont patent's flash EEPROM is illustrated in FIG. 1. Field isolation regions 12 are formed at the surface of a substrate 10, nominally doped P-type, with the field isolation regions 12 defining the active device regions and providing lateral isolation between adjacent devices formed in and on the surface of the substrate 10. A gate oxide layer 14 for the floating gate transistor covers the active device regions of the substrate 10. A gate electrode structure is formed on the gate oxide layer 14 and consists of a floating gate 16 of doped polysilicon covered by an interlayer dielectric layer 18 which is in turn covered by a control gate 20 of doped polysilicon. Oxide spacer structures 22 are provided on either side of the gate electrode structure. The inner edges of source/drain regions 24 define a channel region at the surface of the substrate, with a source/drain region extending from either side of the gate electrode structure to the adjacent field isolation regions 12. Frequently, the source/drain regions 24 have a lightly doped drain (LDD) structure in which an inner, more lightly doped portion of the source/drain region is aligned with the edge of the gate electrode structure, and a more heavily doped portion of the source/drain region 24 is aligned with the outer edge of the oxide spacer structure 22. In some instances, including the floating gate transistors described in the Bergemont patent, an asymmetric source/drain structure is adopted, in which the source electrode is provided with an LDD structure and the drain electrode has more a uniform doping. Such an asymmetric floating gate structure provides advantages for the programming of the floating gate transistor, since the electric field will be greater adjacent the drain electrode in this configuration.

Programming charge is stored onto the floating gate 16 of the FIG. 1 structure in an electron or hole tunneling process. It is typically necessary to apply comparatively high voltages between the control gate and one of the source/drain regions 24 to effect the tunneling through the gate oxide layer 14 during programming of the FIG. 1 floating gate transistor. It is known in the art that the required programming voltage can be reduced by providing a thinner oxide layer beneath the floating gate electrode through which programming occurs. Such a thinner tunneling oxide region is typically provided as a relatively small window beneath the gate electrode and adjacent the drain electrode. The tunneling oxide layer is formed thinner than the rest of the thicker gate oxide layer because excessive leakage might occur if the entire gate oxide layer were made thin which would reduce the stability of the memory. It is, however, difficult to form a tunneling window of a fixed size and with a high quality of oxide. Methods for forming tunneling oxide windows are complicated and inclusion of appropriate tunneling oxide windows for floating gate transistors significantly increase the cost of the flash memory.

Another disadvantage of the floating gate transistor illustrated in FIG. 1 and of the method of making that transistor is that the source/drain electrodes require a significant implantation to ensure that their resistance is sufficiently low to provide good device performance. The required high level of ion implantation causes a variety of problems. For example, the heavy ion implantation dosage renders the substrate amorphous where the source/drain regions are to be formed. Recrystallization of the substrate in the source/drain regions is then performed in an annealing process which can produce defects in the recrystallized material, or which can lead to excessive levels of diffusion from the source/drain regions. Excessive diffusion from the source/drain regions can make the channel region beneath the gate electrode structure narrower than is desired, compromising device performance.

SUMMARY OF THE PREFERRED EMBODIMENTS

According to one aspect, the present invention provides a method of making a nonvolatile memory including an array of floating gate transistors. The method includes the steps of forming a mask over a substrate having a mask opening exposing the surface of the substrate and having walls. First spacers are formed within the mask opening. A gate insulator is provided on the surface of the substrate between the first spacers and then the first spacers are removed. Tunnel oxide layers are formed on either side of the gate insulator, where the tunnel oxide layers are made thinner than the gate insulator. A floating gate electrode is formed in contact with the tunnel oxide layers and the gate insulator.

Another aspect of the invention provides a nonvolatile memory by depositing a first polysilicon layer over a substrate and then forming an opening having walls within the first polysilicon layer. A first spacer of a first insulating material is provided alongside a first wall of the first polysilicon layer and a second spacer of a second material is provided alongside the first spacer. A gate insulator layer is formed on the surface of the substrate within the opening, the gate oxide layer extending from an edge of the second spacer on the surface of the substrate. The second spacer is removed to expose a first portion of the substrate and then a first tunnel oxide layer is formed on the first portion of the substrate exposed in the step of removing the second spacer. A second polysilicon layer is provided on the gate insulator layer and on the tunnel oxide layer and the second polysilicon layer is patterned to laterally define an upper portion of a floating gate electrode.

DETAILED DESCRIPTION OF THE PREFERRED EMBODIMENTS

Figure 1:
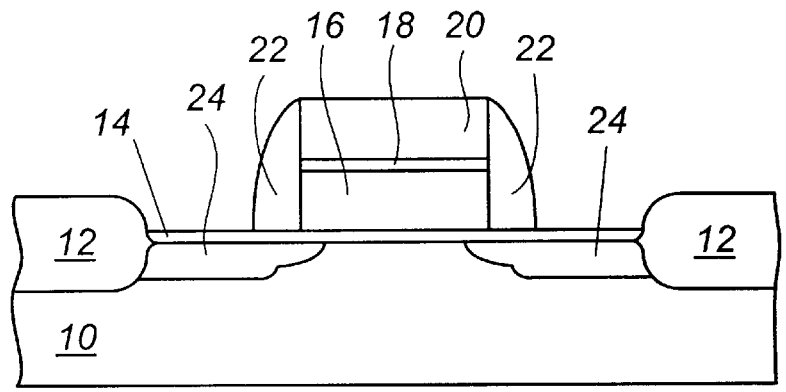
FIG. 1 illustrates a conventional floating gate transistor structure.

Preferred embodiments of the present invention provide a method of forming a floating gate transistor of the type used in nonvolatile memories such as flash memories. One aspect of the present invention forms tunnel oxide regions, preferably adjacent both of the source/drain regions, in a controlled and self-aligned manner. The self-aligned tunnel oxide layers can be formed having reliable dimensions and with high quality oxide layers in a simplified process compatible with reduced manufacturing costs, as well as with more predictable and more reliable performance of the resulting floating gate transistor. Pursuant to a further aspect of the invention, at least the floating gate electrode can be formed in a manner self-aligned to the tunnel oxide layers, increasing the accuracy of the gate definition process and reducing the process controls otherwise required to obtain uniform device performance. By more readily providing reliable and predictable device performance, this self-aligned floating gate formation process can also reduce the costs of producing reliable flash or other nonvolatile memories.

Another aspect of the present invention provides shallower source/drain regions for the floating gate transistor in a controlled manner which can facilitate the formation of smaller floating gate transistors or floating gate transistors having more predictable and consistent properties. This aspect of the invention might also be used to form self-aligned contacts to the source/drain regions in a manner that can form parts of interconnections to and between the source/drain regions of the floating gate transistors.

Briefly, a floating gate transistor in accordance with a particularly preferred embodiment of the present invention may be formed on an active device region defined between field isolation structures. A first polysilicon layer, or a layer of another conductor which can be used in diffusing impurities into the underlying silicon substrate, is provided on the active device region of the substrate and is covered by a layer of insulating material such as silicon oxide. The first polysilicon layer is doped by implantation of impurities, but no annealing step is performed at this time. An opening is formed through the polysilicon layer to expose the surface of the active device region. Oxide spacers and then nitride spacers are formed on the sidewalls of the opening in the first polysilicon layer to define a narrower opening. A gate oxide layer is grown on the active device region between the nitride spacers in a thermal oxidation process which preferably causes impurities to diffuse from the first polysilicon layer into the active device region on either side of the gate electrode, forming source/drain regions for the floating gate transistor. The nitride spacers are then removed in a wet etching process and then tunnel oxide layers are grown on the portions of the active device region exposed when the nitride spacers are removed. A second layer of polysilicon is deposited, followed by an interlayer dielectric and then a third layer of polysilicon. Patterning defines a control gate and a floating gate from the third and second layers of polysilicon, respectively, for the floating gate transistor.

Figure 2:
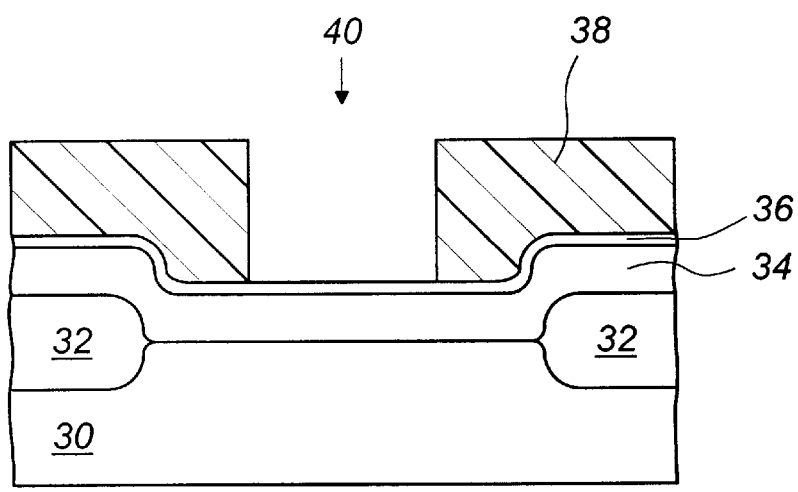
FIGS. 2–6 illustrate steps in the manufacture of a floating gate transistor in accordance with preferred embodiments of the present invention.

These and other aspects of the present invention are now described with particular reference to certain preferred embodiments of the invention illustrated in the figures. Referring first to FIG. 2, formation of a nonvolatile memory such as a flash memory in accordance with the present invention begins on a silicon substrate 30 having at least a P-type surface layer by forming field isolation regions 32 on the surface of the substrate. The field isolation regions may be conventional local oxidation of silicon (LOCOS) oxide structures, or may be shallow trench isolation structures. An advantage of the present invention is that it allows reduced size and improved performance floating gate transistors to be formed using the presently cheaper and more reliable LOCOS technology. However, aspects of the present invention find ready application to devices incorporating shallow trench or other isolation structures.

A layer 34 of polysilicon is blanket deposited over the device, covering the isolation structures 32 and the surface of the substrate within the active regions. As discussed above, one aspect of the invention uses this first polysilicon layer 34 to provide interconnects to and between the source/drain regions of different floating gate transistors. Another aspect of the invention forms the preferred shallow source/drain regions by diffusing impurities from the first polysilicon layer into the active device region of the substrate. For embodiments which combine these two aspects of the invention, it is preferred that the first layer 34 be a conductor through which N-type dopants can be made to diffuse. Other aspects of the invention simply use the first layer 34 in defining the sidewall spacer elements that are removed to expose the substrate within windows of controlled size for the formation of tunnel oxide regions. For such aspects of the invention, it is not important that the layer 34 be conductive. Presently preferred embodiments of the invention form the first layer 34 from polysilicon to enjoy the different advantages discussed above, as well as the process simplification associated with its use. The polysilicon layer 34 may be deposited to a thickness of between 500–5000Å using typical low pressure chemical vapor deposition (LPCVD) polysilicon deposition conditions. First polysilicon layer 34 is covered by a layer 36 of an insulating material such as silicon oxide deposited by chemical vapor deposition (CVD) to a thickness of 200–2000Å. Insulating layer 36 is preferably silicon oxide because the layer can then be used as an etch stop for etching both silicon nitride and polysilicon, facilitating later processing steps preferably used in forming the preferred floating gate transistor.

After providing the insulating layer 36 over the first polysilicon layer 34, it is preferred that dopants be provided to the polysilicon that are suitable for later diffusion from the first polysilicon layer into the substrate to define source/drain regions. For the illustrated transistor, N-type dopants are selected and, most preferably, heavier N-type dopants such as arsenic are selected to limit the extent of diffusion into the substrate. The polysilicon layer 34 is doped by implantation of arsenic ions at an energy of 30–50 KeV to a dosage of $1\times10^{14}$–$1\times10^{16}$/cm$^2$. Most preferably, the implantation energy is sufficiently low that the implanted ions remain within the polysilicon layer 34 and do not reach the substrate, so the implantation does not damage the substrate. To this end, it is preferred that the arsenic implantation be made through the silicon oxide layer 36 because implantation through the oxide layer 36 will shift the distribution of implanted impurities further away from the substrate. The quantity of dopant provided to the polysilicon layer 34 is such that subsequent annealing of the polysilicon layer 34 will cause impurities to diffuse from the polysilicon layer 34 into the substrate 30 in a sufficient quantity to form the source/drain regions for the floating gate transistor. Preferably, in the finished structure, the source/drain regions will lie partially in the polysilicon layer 34 and partially within the substrate 30. Because the portions of the source/drain regions within the substrate are formed by diffusion from the polysilicon layer, they will typically be shallower than source/drain regions formed within the substrate solely by ion implantation into the substrate, followed by diffusion solely within the substrate, as illustrated in FIG. 1. Preferably, no activating anneal is made at this stage of processing to limit the number of thermal processing steps and to limit the extent of diffusion of dopants within the substrate.

Figure 3:
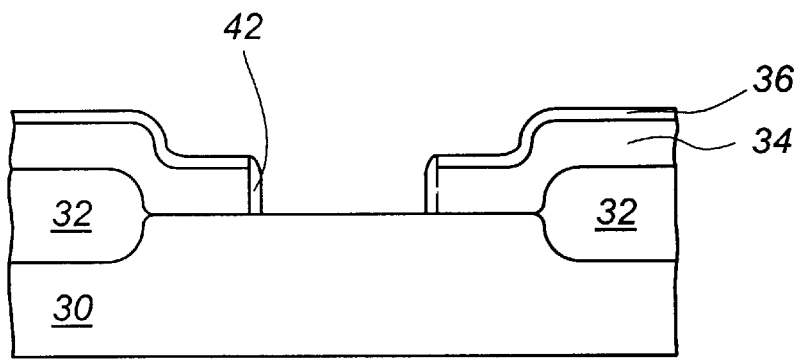

A mask 38 is then formed on the insulating layer 36 having an opening 40 which exposes the insulating layer 36 over a region that will be etched and through which a portion of the first polysilicon layer 34 will be removed to define an opening within which a floating gate electrode will be formed. The illustrated mask 38 may be formed from photoresist by conventional photolithography techniques or may be a hard mask, depending on the particular processes being used. The openings 40 in the mask 38 preferably have a width equal to the design rule for the particular process being used. As will be evident from the following discussion, subsequent processing will result in the formation of a floating gate electrode having an effective length smaller than the length dictated by the design rule of the conventional process. Anisotropic etching of the silicon oxide layer 36 is then performed using, for example, reactive ion etching (RIE) with a source gas of $C_2F_6$, followed by the anisotropic etching of the doped polysilicon layer 34 through the opening 40 in mask 38 using, for example, a plasma etchant derived from HCl and HBr gases to form an opening within the first polysilicon layer 34 (FIG. 3).

A second layer of an insulating material, preferably silicon oxide as is used in the insulating layer 36, is then deposited over the device, for example, by CVD of oxide to a thickness of 100–500Å. The second layer of insulating material is formed into sidewall spacer structures 42 alongside the sidewalls of the opening in the polysilicon layer 34 by an etch back process. Since the sidewall spacer structures are formed in an etch back process, the width of the completed spacer structures will essentially be determined by the thickness of the oxide deposited for the second layer of insulating material. An appropriate etch back process might consist of anisotropic etching using reactive ion etching with a fluorine based etchant, for example, derived from a source gas including $CHF_3$ or $C_2F_6$. This etch back process is stopped on the silicon surface of the active device region and so the etch back process might etch a small portion of oxide layer 36, but almost the entire thickness of the oxide layer 36 will remain after definition of the sidewall spacer structures 42. The resulting structure is illustrated in FIG. 3. The primary functions of the sidewall spacer structures 42 formed from the second layer of insulating material are to provide an etch stop to a subsequent silicon nitride wet etching process and to insulate the edges of the first polysilicon layer 34 from the floating gate electrode in the finished device. Because the structure will be exposed to oxidation processes which will fill in pinholes or other defects in the sidewall spacer structures 42, the width of the sidewall spacer structures is primarily chosen to act as a reliable etch stop for a silicon nitride wet etching process.

Figure 4:
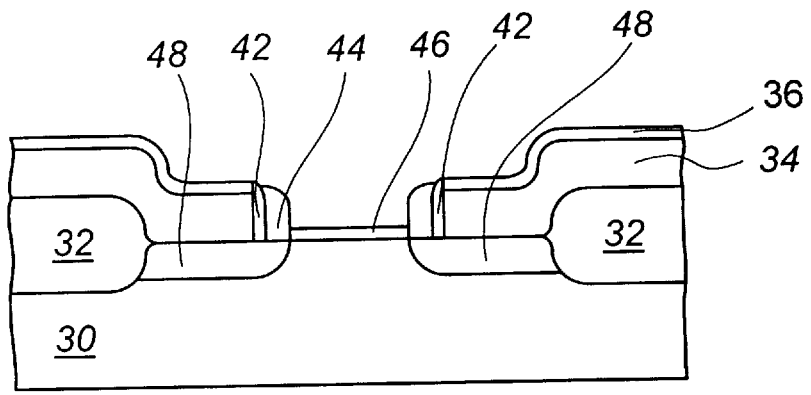

Next, a second set of sidewall spacer structures 44 (FIG. 4) are formed in the opening in the first polysilicon layer 34 from a material different from the first oxide sidewall spacer structures 42. The second spacer sidewall structures 44 will be used to define the lateral extent of the tunnel oxide windows and are preferably formed from a material that does not rapidly oxidize in a thermal oxidation environment. The width of the sidewall spacer structures determine the width of the tunneling oxide regions to be formed and so the width of the sidewall spacer structures is chosen relative to the other dimensions of the floating gate electrode to achieve the desired tunneling and coupling characteristics. The manufacturing techniques used in forming the second sidewall spacer structures 44 and the tunneling oxide layers allow the width of the sidewall spacer structures 44 to be selected anywhere between 100–1000 Å or more. The sidewall spacer structures 44 are formed by depositing a layer of silicon nitride by CVD slightly more than the desired width of the nitride sidewall structures 44 followed by an etch back process using, for example, RIE with a source gas including $SF_6$. The etch back process used to define the silicon nitride sidewall spacer structures 44 is preferably chosen to stop on the surface of the substrate 30 and to not etch too much of the oxide layer 36.

Next, a gate oxide layer 46 for the floating gate transistor is formed by a thermal oxidation process to a thickness of 100–400 Å. The thermal oxidation process might, for example, be performed in a furnace with an oxygen rich environment held at a temperature of 850–1050° C. for between about ten to one hundred minutes. The thermal oxidation process generally will be of sufficient duration to anneal and activate the implanted impurities within the polysilicon lines 34 and will preferably diffuse impurities from the polysilicon lines 34 into the substrate 30 to define source/drain regions 48. Diffusion of the preferred arsenic dopant from the polysilicon lines 34 forms relatively shallow doped regions 48 for the source/drain regions of the floating gate transistor. The portions of the source/drain regions formed within the substrate are generally shallower than those formed by the conventional implantation method illustrated in FIG. 1. In addition, because the source/drain regions 48 within the substrate are formed by diffusion, there is a far lower level of lattice damage from the ion implantation to be annealed out than is typical in ion implanted source/drain regions. Finally, because portions of the source/drain regions reside in the polysilicon lines 34 above the substrate, the doping levels for the source/drain regions 48 within the substrate can be lower than in the conventional FET structure while still providing suitably conductive source/drain regions.

Figure 5:
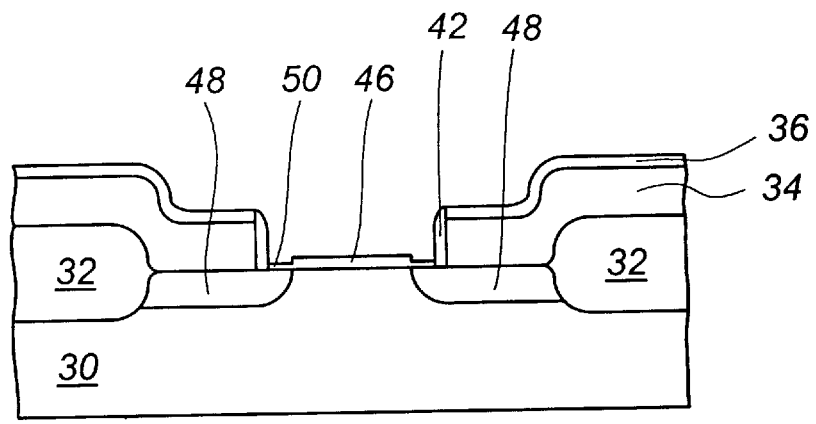

After the gate oxide layer 46 is grown, the nitride spacers 44 are removed, preferably in a wet etching process because such a wet etching process is relatively less damaging to the gate oxide layer 46 than a dry etching process. An appropriate wet etching process might consist of a dip in a heated phosphoric acid solution. Tunnel oxide layers 50 (FIG. 5) are then grown on the portions of the substrate exposed by removing spacers 48 using a thermal oxidation process to grow oxide layers having a thickness of 30–100 Å, as appropriate to the floating gate transistor being formed. The tunnel oxide layers are made thinner than the gate oxide layer to facilitate a carrier hot electron (CHE) tunneling process preferred for programming the floating gate transistor of the present invention. The two tunnel oxide layers 50 also facilitate a lower voltage for the Fowler-Nordheim erasing process preferably used in accordance with the present invention. It should be noted that, if the first sidewall spacers 42 are undesirably thin prior to this point in the process, the thermal oxidation used to form the tunnel oxide layers 50 will oxidize the first polysilicon layer 34 to ensure that its sidewalls are well insulated from the floating gate electrode that will be formed in the opening in the first polysilicon layer 34 and on the gate oxide layer 46 and the tunnel oxide layers 50.

Figure 6:
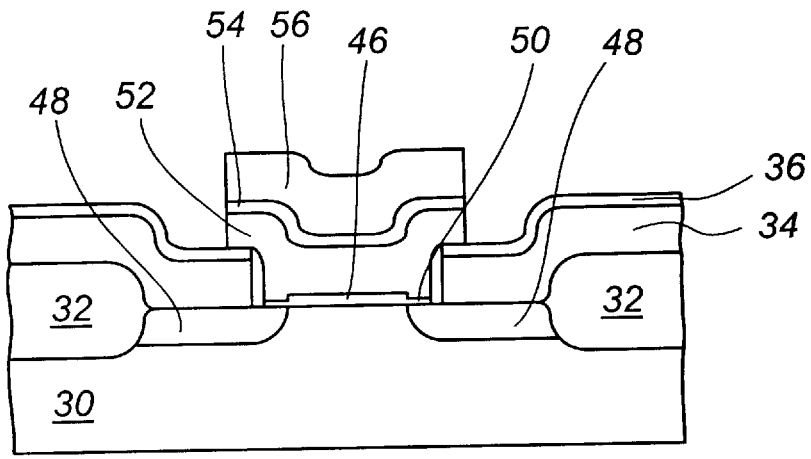

A second layer of polysilicon 52, which will be formed into the floating gate electrode for the transistor, is blanket deposited by LPCVD over the device to a thickness of, for example, between 2000–5000 Å. It is preferred that the first polysilicon layer 34 be separated from the second layer of polysilicon 52 by a reliable insulator, such as the insulating layer 36 and the spacers 42. The second polysilicon layer 52 is doped by arsenic implantation at an energy of 30–50 KeV to a dosage of $1 \times 10^{15}$–$2 \times 10^{16}/cm^2$. An interlayer dielectric layer 54 is then pro on the second polysilicon layer 52. Interlayer dielectric layer 54 might, for example, consist of the three layer oxide, nitride and oxide structure known as "ONO." An ONO layer might include a thin thermal oxide layer natively formed on the surface of the second polysilicon layer 52, a thin (~30–70 Å) thick layer of CVD nitride and then a very thin layer of oxide (~5–10 Å) formed on the nitride layer in a thermal oxidation process. Then, a third layer of polysilicon 56 is deposited again using typical LPCVD conditions to a thickness of 2000–5000 Å and doped in a similar manner to the second polysilicon layer. The three layer structure consisting of the blanket third polysilicon layer, the interlayer (ONO) dielectric layer and the second polysilicon layer is patterned using conventional lithography to laterally define the control gate electrode 56, the interlayer dielectric 54 and the floating gate electrode 52, as shown in FIG. 6. Appropriate etchants for each of the materials within the layer structure have been discussed above. Preferably, this lithography process is chosen so that the insulating layer 54 acts as an etch stop to the etching of polysilicon layer 52. This protects the first polysilicon layer 34. Of course, the lateral extent of the lower portion of the floating gate electrode 52 is defined by the separation between the sidewall spacer structures 42. Annealing is performed to activate the impurities within the gate electrode 56 and processing continues in the conventional manner to complete the desired nonvolatile memory, which is preferably a flash memory otherwise similar in construction to that described in the Bergemont patent.

An advantage of the method described herein for forming the floating gate transistor is that, as a consequence of the manufacture of the source/drain regions and the gate electrodes in the illustrated manner, wiring lines 34 connected to the source/drain regions are naturally formed. Thus, the wiring lines 34 might be incorporated into a reduced conductivity bit line structure for the flash memory. In addition, because of the techniques used to form the tunnel oxide region, tunnel oxide layers 50 are formed over both the source/drain regions. Separate tunnel oxide layers over both the drain and the source regions provide a thin tunnel oxide layer for both programming (drain adjacent tunnel oxide) and erasing (source adjacent tunnel oxide) operations. This results in a lower level of electron and hole trapping and, consequently, a high level of reliability and longer life for the resulting flash memory. The following table shows the reduced programming and erasing voltages that may be used in conjunction with a flash memory incorporating the floating gate transistors of the present invention:

|  | Control Gate (V) | Drain (V) | Source (V) | Substrate (V) |
| --- | --- | --- | --- | --- |
| Program | 12 | 0 | floating | 0 |
| Erase | −8 | 0 | 5 | 0 |
| Read | 3 | 1 | 0 | 0 |

While the present invention has been described with particular emphasis on certain preferred embodiments thereof, the invention is not limited to these particular embodiments. Those of ordinary skill will appreciate that different implementations of this invention and alternated variations can be made, consistent with the teachings herein. Accordingly, the scope of the invention is to be determined by the claims which follow.

What is claimed:

1. A method of making a nonvolatile memory, including an array of floating gate transistors, comprising the steps of:

forming a mask over a substrate, wherein the mask comprises a conductive material and has a mask opening exposing a surface of the substrate, the mask opening having walls;

forming first spacers within the mask opening;

forming a gate insulator on the surface of the substrate between the first spacers;

removing the first spacers and then forming tunnel oxide layers on both sides of the gate insulator, the tunnel oxide layers being thinner than the gate insulator; and forming a floating gate electrode in contact with the tunnel oxide layers and the gate insulator, wherein the floating gate electrode extends over a portion of the mask.

2. The method of claim 1, further comprising the step of heating to diffuse impurities from the mask into the substrate to form at least parts of source/drain regions adjacent the walls of the mask opening.

3. A method of making a nonvolatile memory, including an array of floating gate transistors comprising the steps of:

forming a mask over a substrate, wherein the mask comprises a conductive material and has a mask opening exposing a surface of the substrate, the mask opening having walls;

heating the mask to diffuse impurities from the mask into the substrate to form at least parts of source/drain regions adjacent the walls of the mask opening;

forming first spacers within the mask opening;

forming a gate insulator on the surface of the substrate between the first spacers;

removing the first spacers and then forming tunnel oxide layers on both sides of the gate insulator, the tunnel oxide layers being thinner than the gate insulator; and forming a floating gate electrode in contact with the tunnel oxide layers and the gate insulator.

4. The method of claim 3, wherein the mask comprises polysilicon.

5. The method of claim 4, further comprising the step of forming a set of oxide spacers on the walls of the opening in the mask prior to forming the first spacers within the mask opening.

6. The method of claim 5, wherein the first spacers are formed by depositing a layer of silicon nitride and then etching back the layer of silicon nitride to define the first spacers.

7. The method of claim 6, wherein the first spacers are removed in a wet etching process.

8. The method of claim 7, wherein the wet etching process using a heated phosphoric acid solution.

9. The method of claim 8, further comprising the steps of:
   forming an interlayer dielectric layer over the floating gate electrode; and
   forming a control gate electrode over the floating gate electrode, the control gate electrode separated from the floating gate electrode by the interlayer dielectric layer.

10. The method of claim 1, wherein edges of each of the tunnel oxide layers are aligned with lower edges of the floating gate electrode.

11. A method of providing a nonvolatile memory, comprising the steps of:
    depositing a first polysilicon layer over a substrate;
    forming an opening having walls within the first polysilicon layer;
    providing a first spacer of a first insulating material alongside a first wall of the first polysilicon layer;
    providing a second spacer of a second material alongside the first spacer;
    forming a gate insulator layer on the surface of the substrate within the opening, the gate oxide layer extending from an edge of the second spacer on the surface of the substrate;
    removing the second spacer to expose a first portion of the substrate;
    forming a first tunnel oxide layer on the first portion of the substrate exposed in the step of removing the second spacer;
    depositing a second polysilicon layer on the gate insulator layer and on the first tunnel oxide layer; and
    patterning the second polysilicon layer to laterally define an upper portion of a floating gate electrode.

12. The method of claim 11, further comprising the steps of:
    providing a third spacer of the first insulating material alongside a second wall of the first polysilicon layer;
    providing a fourth spacer of the second material alongside the third spacer, wherein the gate oxide layer is formed to extend from the second spacer to the fourth spacer on the surface of the substrate;
    removing the fourth spacer to expose second portion of the substrate; and
    forming a second tunnel oxide layer on the a second portion of the substrate exposed in the step of removing the fourth spacer.

13. The method of claim 12, further comprising the step of implanting first impurities into the first polysilicon layer prior to forming the opening in the first polysilicon layer.

14. The method of claim 13, wherein the first polysilicon layer contacts the surface of the substrate adjacent the opening.

15. The method of claim 14, further comprising the step of diffusing the first impurities from the first polysilicon layer into the substrate, forming at least a portion of source/drain regions on either side of the floating gate electrode.

16. The method of claim 13, further comprising the step of providing a layer of oxide over the surface of the first polysilicon layer prior to the step of implanting first impurities into the first polysilicon layer.

17. The method of claim 11, wherein the first insulating material is silicon dioxide and wherein the second material is silicon nitride.

18. The method of claim 17, wherein the step of removing the second spacer includes a wet etching process.

19. The method of claim 18, wherein the wet etching process utilizes a heated phosphoric acid solution.

20. The method of claim 11, wherein the first spacer is formed by depositing by CVD a layer of oxide followed by an anisotropic etch back process that forms the first spacer on the first wall of the opening.

21. The method of claim 11, wherein the second spacer is formed by depositing by CVD a layer of nitride followed by an anisotropic etch back process that forms the second spacer alongside the first spacer within the opening.

22. The method of claim 12, wherein the upper portion of the floating gate electrode extends laterally over the walls of the opening and over the first polysilicon layer.

23. The method of claim 22, wherein the upper portion of the floating gate electrode is separated from the first polysilicon layer by an oxide layer.

24. The method of claim 11, further comprising the steps of:
    forming an interlayer dielectric layer over the floating gate electrode; and
    forming a control gate electrode over the floating gate electrode, the control gate electrode separated from the floating gate electrode by the interlayer dielectric layer.

25. The method of claim 12, wherein edges of the first and second tunnel oxide layers are aligned with lower edges of the floating gate electrode.

26. The method of claim 25, further comprising the steps of:
    forming an interlayer dielectric layer over the floating gate electrode; and
    forming a control gate electrode over the floating gate electrode, the control gate electrode separated from the floating gate electrode by the interlayer dielectric layer.

* * * * *